(12) United States Patent
Kim

(10) Patent No.: US 12,339,707 B1
(45) Date of Patent: Jun. 24, 2025

(54) FLEXIBLE DISPLAY DEVICE

(71) Applicant: LG Display Co., Ltd., Seoul (KR)

(72) Inventor: SangWon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/765,517

(22) Filed: Jul. 8, 2024

(30) Foreign Application Priority Data

Dec. 14, 2023 (KR) .......................... 10-2023-0181872

(51) Int. Cl.
| | |
|---|---|
| *G06F 1/16* | (2006.01) |
| *G06F 1/20* | (2006.01) |
| *G09F 9/30* | (2006.01) |
| *H10K 59/80* | (2023.01) |

(52) U.S. Cl.
CPC .............. *G06F 1/1652* (2013.01); *G06F 1/20* (2013.01); *G09F 9/301* (2013.01); *H10K 59/8794* (2023.02)

(58) Field of Classification Search
CPC .... G06F 1/1652; G09F 9/301; H10K 89/8794
See application file for complete search history.

(56) References Cited

U.S. PATENT DOCUMENTS

| | | | |
|---|---|---|---|
| 2023/0213964 A1* | 7/2023 | Lee ....................... | G06F 1/1686 361/679.21 |
| 2023/0383152 A1* | 11/2023 | Kim ....................... | G06F 1/1616 |

* cited by examiner

*Primary Examiner* — Karabi Guharay
(74) *Attorney, Agent, or Firm* — Morgan, Lewis & Bockius LLP

(57) ABSTRACT

A flexible display device is provided with improved heat dissipation efficiency. The flexible display device includes: a support frame having an accommodating space formed therein; a display panel disposed in the accommodating space of the support frame; a heat dissipation plate disposed on the rear surface of the display panel; and a cushion portion disposed between the heat dissipation plate and the support frame and formed to be elastically deformable.

21 Claims, 13 Drawing Sheets

FLEXIBLE DISPLAY DEVICE

CROSS-REFERENCE TO RELATED APPLICATION

This application claims priority from Korean Patent Application No. 10-2023-0181872, filed on Dec. 14, 2023, which is hereby incorporated by reference for all purposes as if fully set forth herein.

BACKGROUND

Technical Field

Embodiments of the disclosure relate to a flexible display device.

Discussion of the Related Art

Recently, with the advent of the information era, the field of displays that visually express electrical information signals has rapidly developed. Correspondingly, diverse display devices have been developed which have excellent performance, such as slim design, light weight, and low power consumption.

Specific examples of such display devices include liquid crystal display devices (LCDs), plasma display panel devices (PDPs), field emission display devices (FEDs), and organic light emitting display devices (OLEDs).

Recently, flexible display devices, which are fabricated using flexible materials such as plastic materials instead of existing inflexible glass substrates and may maintain their display performance even when bent like paper, have rapidly emerged as next-generation display devices.

A flexible display device may generally include a display panel configured to display an image, a heat dissipation plate disposed on the rear surface of the display panel, and a support frame on which the display panel and heat dissipation plate are seated. In this case, in order to prevent the display panel from being damaged when an external force is applied to bend the flexible display device, an air gap is formed between the display panel and the support frame.

Due to this air gap, a problem arises in that convection and radiation occur between the heat dissipation plate and the support frame, increasing the temperature of the display panel, which adversely affects afterimages and lifespan of the display panel.

SUMMARY

Accordingly, embodiments of the present disclosure are directed to a flexible display device that substantially obviates one or more of the problems due to limitations and disadvantages of the related art.

An aspect of the present disclosure is to provide a flexible display device in which a cushion portion including a conductive material is disposed between the display panel and the support frame so that heat dissipated from the heat dissipation plate may be exchanged through the cushion portion and dissipated to the outside of the support frame.

Another aspect of the present disclosure is to provide a flexible display device having improved heat dissipation efficiency because an air gap is not formed due to the cushion portion disposed between the display panel and the support frame.

Another aspect of the present disclosure is to provide a flexible display device capable of exhibiting high brightness, long lifespan, low power consumption, and improved afterimages by effectively removing heat, generated in the display panel, through the heat dissipation plate and the cushion portion.

Another aspect of the present disclosure is to provide a flexible display device in which an elastically deformable cushion portion is disposed between the heat dissipation plate and the support frame so that the flexible display device exhibits improved durability by absorbing an externally applied impact by the cushion portion.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a flexible display device comprises: a support frame having an accommodating space formed therein; a display panel disposed in the accommodating space of the support frame; a heat dissipation plate disposed on the rear surface of the display panel; and a cushion portion disposed between the heat dissipation plate and the support frame and formed to be elastically deformable.

According to embodiments of the present disclosure, it is possible to provide a flexible display device in which a cushion portion including a conductive material is disposed between the display panel and the support frame so that heat dissipated from the heat dissipation plate may be exchanged through the cushion portion and dissipated to the outside of the support frame.

According to embodiments of the present disclosure, it is possible to provide a flexible display device having improved heat dissipation efficiency because an air gap is not formed due to the cushion portion disposed between the display panel and the support frame.

According to embodiments of the present disclosure, it is possible to provide a flexible display device capable of exhibiting high brightness, long lifespan, low power consumption, and improved afterimages by effectively removing heat, generated in the display panel, through the heat dissipation plate and the cushion portion.

According to embodiments of the present disclosure, it is possible to provide a flexible display device in which an elastically deformable cushion portion is disposed between the heat dissipation plate and the support frame so that the flexible display device exhibits improved durability by absorbing an externally applied shock by the cushion portion.

It is to be understood that both the foregoing general description and the following detailed description are exemplary and explanatory and are intended to provide further explanation of the inventive concepts as claimed

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
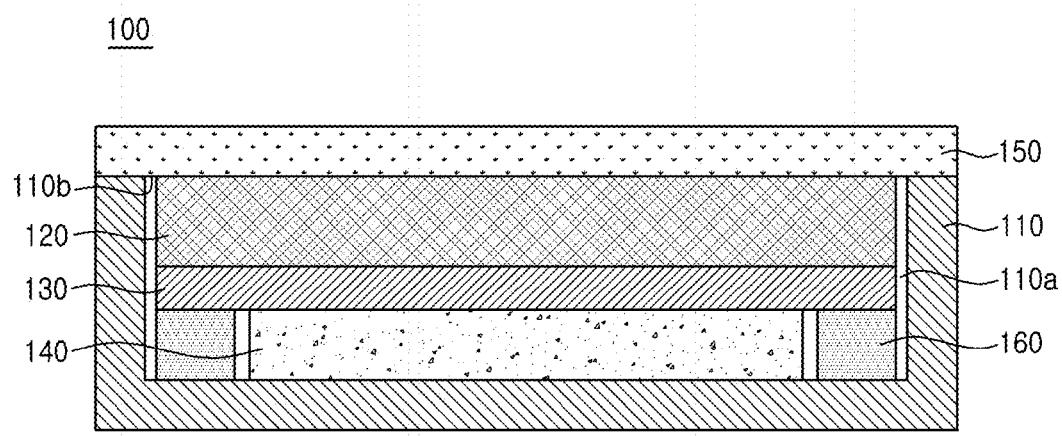
FIG. 1 is a cross-sectional view of a flexible display device according to one embodiment of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a cross-sectional view of a flexible display device according to one embodiment of the present disclosure.

Referring to FIG. 1, a flexible display device 100 may include a support frame 110, a display panel 120, a heat dissipation plate 130, a cushion portion 140, and a cover glass 150.

In the following embodiments of the present disclosure, for convenience of explanation, under the premise that the display surface of the display panel 120, which displays an image, faces forward, a description will be made of an example in which the heat dissipation plate 130 and the cushion portion 140 are located at the rear of the display panel 120 and are located below the display panel 120 in the drawings.

The support frame 110 serves to accommodate and protect various members therein, and an accommodating space 110a may be formed therein. For example, the support frame 110 may be formed in a square box shape with an open front. Accordingly, the display panel 120, the heat dissipation plate 130, and the cushion portion 140 may be accommodated through the opening 110b formed at the front and may be seated in the accommodating space 110a.

The support frame 110 may be formed of a metal material capable of elastic deformation and restoration in order to achieve bending. When the support frame 110 is formed of a metal material capable of elastic deformation and restoration as described above, bending may be achieved and the heat generated during driving of the flexible display device 100 may be dissipated externally after heat exchange.

The display panel 120 is a panel that displays an image, and may include a light-emitting element for displaying an image, a circuit for driving the light-emitting element, and a wiring, and it may be disposed in the accommodating space 110a of the support frame 110.

The display panel 120 may be composed of an organic light emitting display panel that may maintain its display performance even when bent like paper. The configuration of this display panel is not limited to the above example, and the display panel may be composed of a liquid crystal display panel, an electric field emission display panel, or the like.

The heat dissipation plate 130 serves to externally dissipate the heat generated in the display panel 120, and may be disposed on the rear surface of the display panel 120. For example, the heat dissipation plate 130 is composed of any one selected from among aluminum (Al), copper (Cu), zinc (Zn), silver (Ag), gold (Au), and iron (Fe), which have high thermal conductivity, or may be composed of an alloy of two or more of these metals. Specifically, the heat dissipation plate 130 is preferably formed of aluminum or an aluminum alloy, which has the characteristics of high thermal conductivity, low weight, and low cost.

The end of the heat dissipation plate 130 may be formed not to exceed the end of the display panel 120. That is, the edge portion of the heat dissipation plate 130 may be formed so as not to exceed the edge of the display panel 120. This is because a large amount of heat is not generated at the edge of the display panel 120, and thus even if the end of the heat dissipation plate 130 is formed not to exceed the end of the display panel 120, the heat dissipation efficiency is not lowered and the product may become compact and lightweight.

The cushion portion 140 is disposed between the heat dissipation plate 130 and the support frame 110, and may be formed to be elastically deformable. As the cushion portion 140 formed to be elastically deformable is disposed between the heat dissipation plate 130 and the support frame 110 as described above, when an external force is applied to bend the display panel 120, the cushion portion 140 may be compressed according to the shape of the display panel 120, thus preventing damage to the display panel 120. In addition, vibration occurring during driving of the display panel 120 may be absorbed by the cushion portion 140. In addition, when the cushion portion 140 is applied to a vehicle display device, the impact applied to the display panel 120 during driving may be absorbed by the cushion portion 140, thus minimizing deformation of or damage to the display panel 120.

The cushion portion 140 may include a thermally conductive material. For example, the cushion portion 140 may include a metal such as aluminum, copper, or nickel, or graphite, which has good thermal conductivity.

As the cushion portion 140 including a thermally conductive material is disposed between the heat dissipation plate 130 and the support frame 110 as described above, the cushion portion 140, together with the heat dissipation plate 130, may externally dissipate the heat generated in the display panel 120, thus improving heat dissipation efficiency.

Figure 2:
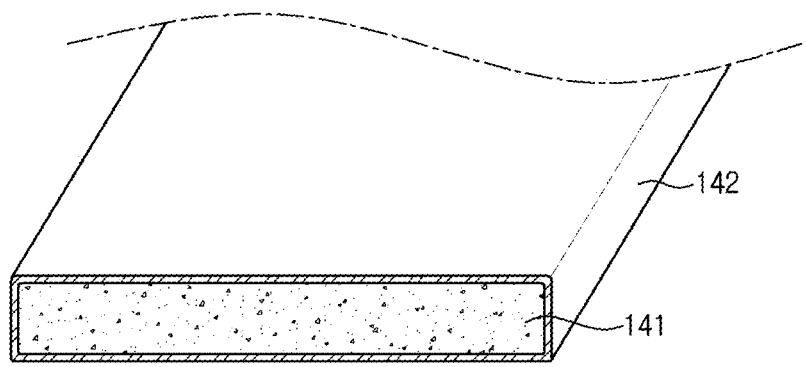
FIG. 2 is a cross-sectional perspective view of a cushion portion according to one embodiment of the present disclosure.

FIG. 2 is a cross-sectional perspective view of a cushion portion according to one embodiment of the present disclosure. The configuration of the cushion portion 140 will be described below with reference to FIG. 2.

As illustrated in FIG. 2, the cushion portion 140 may include a body portion 141 and a thermally conductive coating portion 142.

The body portion 141 serves to absorb the impact applied to the display panel 120, and may be formed of an expandable foam material. For example, the body portion 141 may be composed of one selected from among polyurethane foam, phenolic resin foam, polyvinyl chloride foam, polypropylene foam, and polyethylene foam.

The thermally conductive coating portion 142 serves to secondarily exchange heat with the heat primarily exchanged through the heat dissipation plate 130 and dissipate the heat to the outside of the support frame 110, and may be formed on the surface of the body portion 141. For example, the thermally conductive coating portion 142 may be composed of a metal, such as aluminum, copper, or nickel, or a graphite material, and may be formed on the surface of the body portion 141 by a method such as plating.

The front surface of the thermally conductive coating portion 142 may be in contact with the heat dissipation plate 130, and the rear surface thereof may be in contact with the support frame 110. Accordingly, the thermally conductive coating portion 142 may receive the heat primarily exchanged through the heat dissipation plate 130, secondarily exchange heat with the received heat, and then dissipate the heat toward the support frame 110. As heat exchange may occur once more through the thermally conductive coating portion 142 as described, the heat dissipation efficiency of the flexible display device 100 may be improved.

Figure 3:
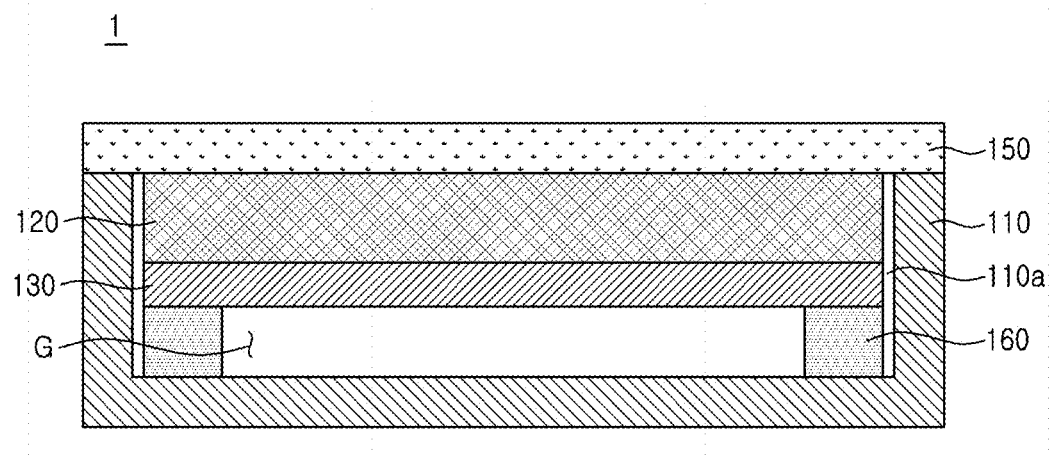
FIG. 3 is a cross-sectional view illustrating a flexible display device without a cushion portion according to a comparative embodiment.

FIG. 3 is a cross-sectional view illustrating a flexible display device without a cushion portion according to a comparative embodiment.

Referring to FIG. 3, the flexible display device 1 according to the comparative embodiment has the same configuration as the flexible display device 100 of the embodiment of the present disclosure, but differs from the flexible display device 100 in that an air gap G is formed between the heat dissipation plate 130 and the support frame 110 because the cushion portion 140 is not disposed between the heat dissipation plate 130 and the support frame 110.

Figure 4A:
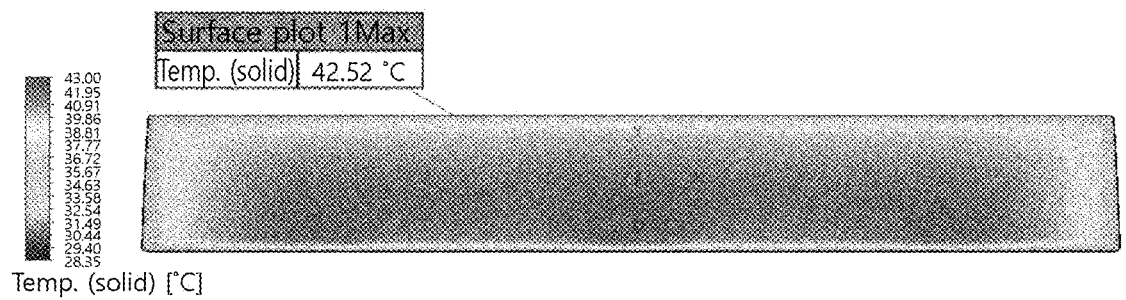
FIG. 4A shows the surface temperature of the flexible display device according to one embodiment of the present disclosure.
Figure 4B:
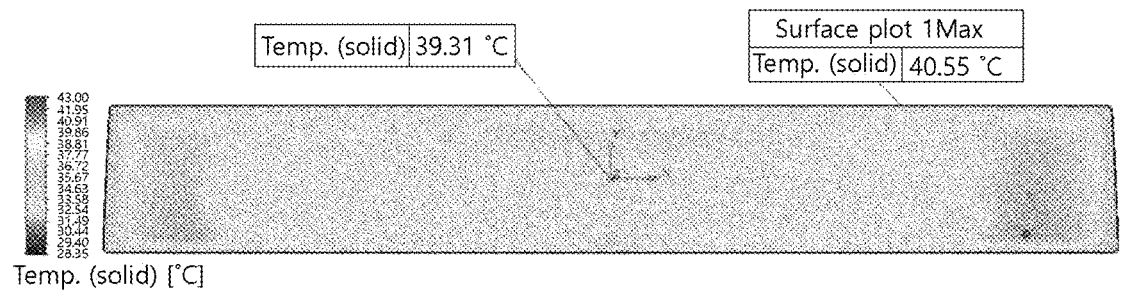
FIG. 4B shows the surface temperature of the flexible display device according to the comparative embodiment.

FIG. 4A shows the surface temperature of the flexible display device according to one embodiment of the present disclosure, and FIG. 4B shows the surface temperature of the flexible display device according to the comparative embodiment.

The embodiment of the present disclosure and the comparative embodiment were tested under the conditions of room temperature (25° C.) and brightness of 900 nits. The cushion portion 140 in the embodiment of the present disclosure had a hardness of 20 and a thickness of 3 mm, and a thermally conductive material was formed on the outer peripheral surface of the cushion portion 140 by coating copper having a thermal conductivity of 401 W/(m*k). As a result, the maximum temperature of the flexible display device 100 according to the embodiment of the present disclosure was measured to be 40.55° C., and the maximum temperature of the flexible display device 1 according to the comparative embodiment was measured to be 42.52° C.

From these results, it can be seen that, when the cushion portion 140 including a thermally conductive material is disposed between the heat dissipation plate 130 and the support frame 110, the surface temperature of the flexible display device 100 is lowered compared to that of the flexible display device 1 according to the comparative embodiment. This is because, due to the air gap G formed between the heat dissipation plate 130 and the support frame 110, the flexible display device 1 according to the comparative embodiment does not easily dissipate heat, dissipated from the heat dissipation plate 130, to the outside of the support frame 110 by convection and radiation acting within the air gap G.

On the other hand, in the flexible display device 100 according to the embodiment of the present disclosure, heat dissipated from the heat dissipation plate 130 may be exchanged through the cushion portion 140 and easily dissipated to the outside of the support frame 110, because the air gap G is not formed between the heat dissipation plate 130 and the support frame 110 due to the cushion portion 140 and the cushion portion 140 includes a thermally conductive material. Therefore, when the cushion portion 140 including a thermally conductive material is disposed between the heat dissipation plate 130 and the support frame 110 as in the embodiment of the present disclosure, the heat dissipation efficiency of the flexible display device 100 may be improved.

The cover glass 150 serves to protect the display panel 120 from external impacts and scratches, and may be disposed at the front of the support frame 110. Accordingly, the cover glass 150 may shield the opening 110b formed at the front of the support frame 110, thereby preventing water or foreign substances from penetrating into the display panel 120.

The cover glass 150 may be composed of a material that has impact resistance and light-transmitting properties. For example, the cover glass 150 may be composed of a glass substrate or may be composed of a plastic thin film formed of one selected from among polymethylmethacrylate (PMMA), polyimide (PI), polyethylene terephthalate (PET), and combinations thereof.

According to embodiments of the present disclosure, the heat dissipation plate 130 may be fixed within the support frame 110 by a double-sided foam tape 160. For example, the double-sided foam tape 160 may be disposed along the rear edge of the heat dissipation plate 130, and the cushion portion 140 may be disposed inside the double-sided foam tape 160 so as to be spaced apart from the double-sided foam tape 160.

As the heat dissipation plate 130 is fixed on the support frame 110 by the double-sided foam tape 160 as described above, the double-sided foam tape 160, together with the cushion portion 140, is capable of elastic deformation and restoration when bending the flexible display device 100. Thus, in the process of applying an external force to the display panel 120, damage to the display panel 120 is minimal, and the heat dissipation plate 130 may be prevented from being detached from the support frame 110, due to its improved adhesion.

The adhesive layers formed on the front and rear surfaces of the double-sided foam tape 160 may include a thermally conductive material. For example, the adhesive layers may be formed by mixing metal powder with an acrylic or silicone adhesive. Accordingly, heat dissipated from the heat dissipation plate 130 may also be exchanged through the double-sided foam tape 160, thus improving heat dissipation efficiency.

Meanwhile, the cushion portion 140 may be formed to be equal to or greater than the height of the double-sided foam tape 160 and to be smaller than the height of the accommodating space 110a. This is because, if the height of the cushion portion 140 is smaller than the height of the double-sided foam tape 160, an air gap is formed between the cushion portion 140 and the heat dissipation plate 130, thus reducing heat dissipation efficiency, and the cushion portion 140 may not be stably fixed on the support frame 110. In addition, if the height of the cushion portion 140 is greater than the height of the accommodating space 110a, the cushion portion 140 may be exposed to the outside rather than being located within the accommodating space 110a. For this reason, the height of the cushion portion 140 is preferably smaller than the height of the accommodating space 110a.

Figure 5:
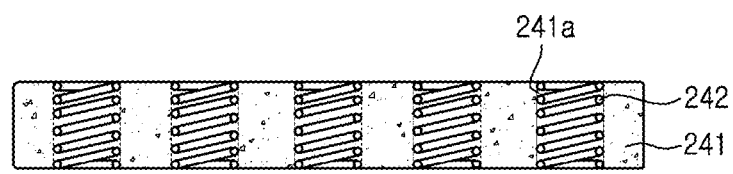
FIGS. 5 to 7 illustrate the configurations of cushion portions according to other embodiments of the present disclosure.

FIG. 5 is a cross-sectional view showing the configuration of a cushion portion according to another embodiment of the present disclosure. This embodiment will be described focusing on the differences from the previously described embodiment.

Referring to FIG. 5, a cushion portion 240 may include an elastically deformable member 241 and a spring member 242.

The elastically deformable member 241 is formed of an expandable foam material and may have a plurality of seating holes 241a. For example, the elastically deformable member 241 may be formed to be long in the vertical direction in the drawing and may have circular seating holes 241a spaced apart from each other.

The spring member 242 is disposed in each seating hole 241a provided in the elastic deformable member 241 and may be formed of a thermally conductive material. For example, the spring member 242 may be composed of a metal, such as aluminum, copper, or nickel, or a graphite material, and the spring member 242 may be disposed in the seating holes 241a so that both ends thereof come into contact with the heat dissipation plate 130 and the support frame 110, respectively.

As the ends of the spring member 242 composed of a thermally conductive material contact the heat dissipation plate 130 and the support frame 110 as described above, the heat exchanged through the heat dissipation plate 130 may be exchanged once more through the spring member 242 and then dissipated toward the support frame 110. In addition, since the spring member 242 is elastically deformed when an external force is applied to the display panel 120 for bending, the display panel 120 may be bent without being damaged.

Figure 6:
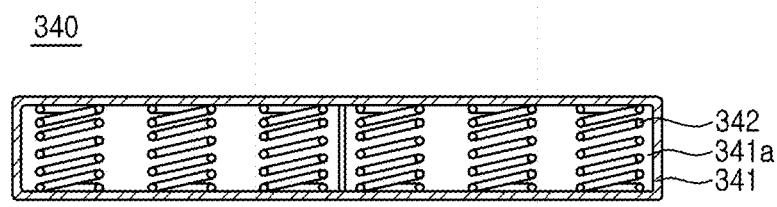

FIG. 6 is a cross-sectional view showing the configuration of a cushion portion according to another embodiment of the present disclosure. This embodiment will be described focusing on the differences from the previously described embodiment.

Referring to FIG. 6, the cushion portion 340 may include a cover portion 341 and a spring member 342.

The cover portion 341 may have a plurality of pockets 341a formed therein. For example, the cover portion 341 may be composed of a resin or fabric material, and the internal space thereof may be divided into the plurality of pockets 341a.

The surface of the cover portion 341 may be coated with a thermally conductive coating material. Here, the thermally conductive coating material may be composed of a metal, such as aluminum, copper, or nickel, or a graphite material, and may be coated by a method such as plating. As the surface of the cover portion 341 is coated with the thermally conductive coating material as described above, the heat primarily exchanged through the heat dissipation plate 130 may be exchanged secondarily and dissipated to the outside of the support frame 110.

The cover portion 341 may be fixed to the heat dissipation plate 130 and the support frame 110 by an adhesive member including metal or graphite powder. In this case, there is an advantage in that the heat exchanged through the heat dissipation plate 130 may be exchanged once more through the adhesive member and dissipated to the outside of the support frame 110, thus improving heat dissipation efficiency.

A plurality of spring members 342 may be provided and disposed inside each pocket 341a. For example, the plurality of spring members 342 may be provided in one pocket 341a so as to be spaced apart from each other, and may be formed of a metal material. This configuration of the spring member 342 enables elastic deformation of the cushion portion 140, thereby preventing damage to the display panel 120 during bending.

Although this embodiment illustrates that the spring members 342 alone are disposed in the pocket 341a, expandable foam may further be disposed together with the spring members 342 in the pocket 341a.

Figure 7:
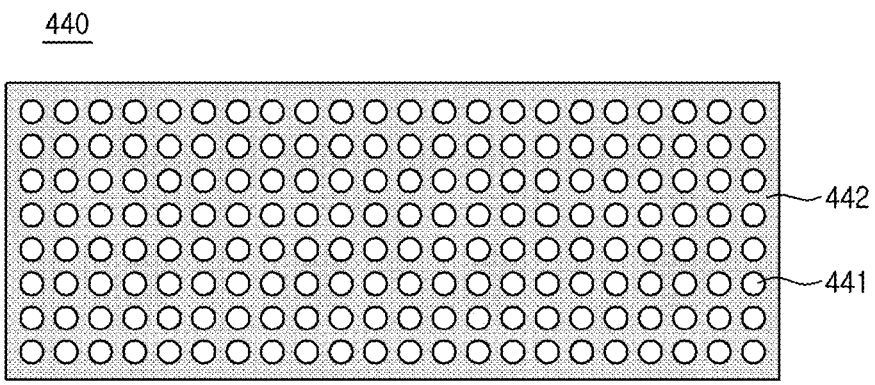

FIG. 7 is a plan view showing the configuration of a cushion portion according to another embodiment of the present disclosure. This embodiment will be described focusing on differences from the previously described embodiment.

Referring to FIG. 7, the cushion portion 440 may be formed of a metal material having a plurality of pores 441 formed therein. That is, the cushion portion 440 may be formed to be capable of compression and restoration by forming a plurality of pores 441 in a body 442 made of a metal material to lower the density.

As the cushion portion 140 is entirely formed of a metal material as described above, the heat exchange area may be increased, allowing the heat generated from the display panel 120 to be dissipated more quickly and effectively. Accordingly, it is possible to prevent the temperature of the display panel 120 from rising, thereby reducing afterimage defects and improving the lifespan.

Figure 8:
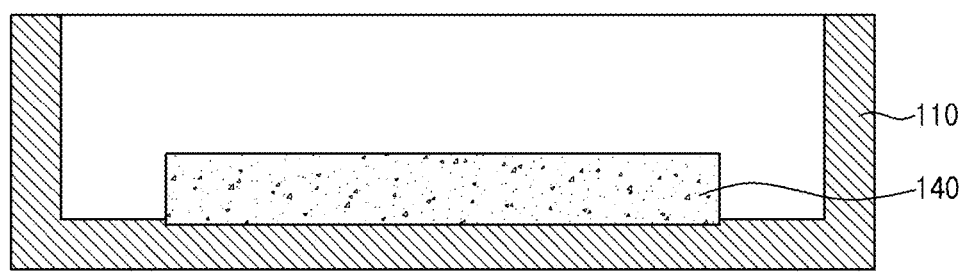
FIG. 8 shows a state in which a cushion portion according to one embodiment of the present disclosure is fixed on a support frame.

FIG. 8 shows a state in which a cushion portion according to one embodiment of the present disclosure is fixed on a support frame.

Referring to FIG. 8, the cushion portion 140 may be formed integrally with the support frame 110, and thus the cushion portion 140 may be fixed on the support frame 110 without a separate fastening tool. For example, during injection molding of the support frame 110, the cushion portion 140 may be fixed to the support frame through an insert injection molding method in which a portion of the cushion portion 140 is inserted into the support frame 110.

Figure 9:
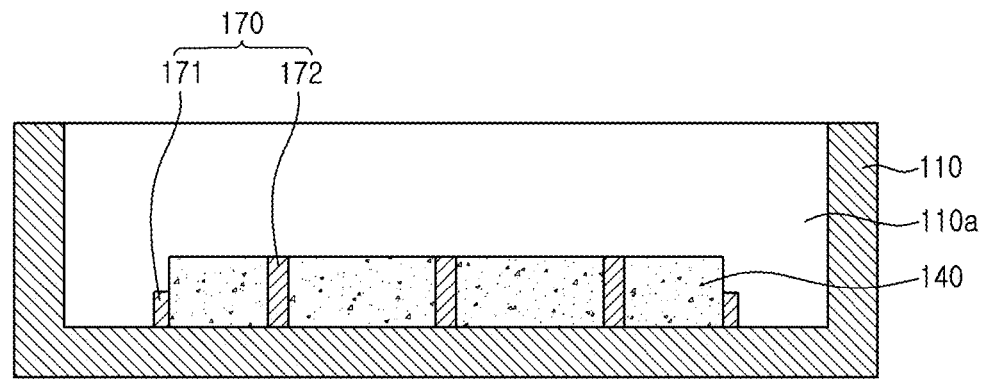
FIGS. 9 and 10 show a state in which cushion portions according to other embodiments of the present disclosure are each fixed on a support frame.

FIG. 9 shows a state in which a cushion portion according to another embodiment of the present disclosure is fixed on a support frame. This embodiment will be described focusing on the differences from the previously described embodiment.

Referring to FIG. 9, the cushion portion 140 may be fixed within the support frame 110 by guide pins 170 protruding from the bottom surface of the support frame 110. For example, the guide pins 170 may include a plurality of first guide pins 171 supporting the side portion of the cushion portion 140, and a plurality of second guide pins 172 disposed spaced apart from each other inside the first guide pins 171 and penetrating the cushion portion 140. Here, the end of the first guide pin 171 may be formed to contact the heat dissipation plate 130, and the end may be coated with a thermally conductive material.

Meanwhile, the upper and lower surfaces of the cushion portion 140 are shielded by the heat dissipation plate 130 and the support frame 110, respectively, and thus even if the guide pins 170 fix only the side of the cushion portion 140, the cushion portion 140 may be stably fixed on the support frame 110.

Figure 10:
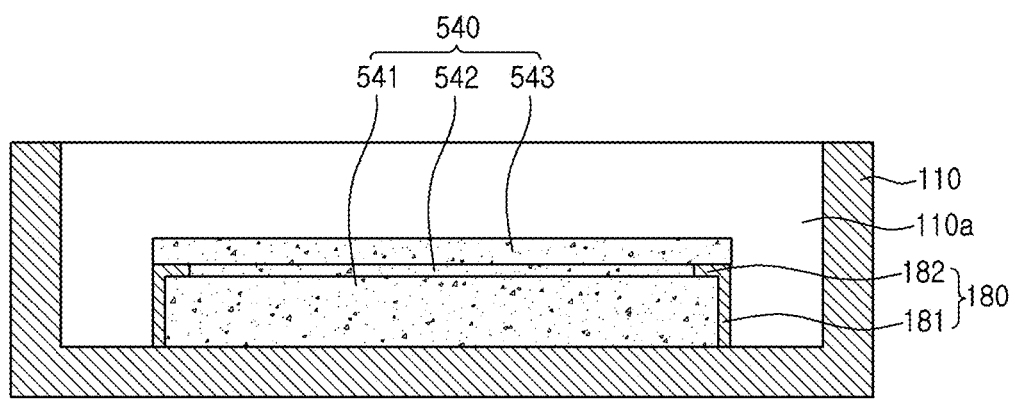

FIG. 10 shows a state in which a cushion portion according to another embodiment of the present disclosure is fixed on a support frame. This embodiment will be described focusing on the differences from the previously described embodiment.

Referring to FIG. 10, the support frame 110 may include a fixing portion 180 that covers and fixes a portion of the cushion portion 540 within the accommodating space 110a, and the cushion portion 540 may be fixed on the support frame 110 by the fixing portion 180.

Specifically, the fixing portion 180 may include a protruding member 181 and a detachment prevention portion 182.

The protruding member 181 may be formed to protrude from the inner bottom surface of the support frame 110 and cover the side of the cushion portion 540. For example, the protruding member 181 may be formed of the same material as that of the support frame 110 and may have a square ring shape covering the side of the cushion portion 540.

The detachment prevention portion 182 may extend inward from the end of the protruding member 181 and support a portion of the cushion portion 540. For example, the detachment prevention portion 182 may be formed of the same material as that of the support frame 110, and may have a square ring shape covering a portion of the upper side of the cushion portion 540. As the detachment prevention portion 182 is formed to cover a portion of the upper side of the cushion portion 540 as described above, the cushion portion 540 may be fixed on the support frame 110.

The cushion portion 540 according to this embodiment may include: a first cushion layer 541 whose sides are covered by the protruding member 181 and a portion of the front side of which is covered by the detachment prevention portion 182; a second cushion layer 542 which is disposed on the first cushion layer 541 and whose sides are covered by the detachment prevention portion 182; and a third cushion layer 543 which is disposed on the second cushion layer 542.

Due to this configuration of the cushion portion 540, the cushion portion 540 may be fitted into the fixing portion 180. That is, when the cushion portion 540 is compressed by applying an external force and then the first cushion layer 541 is inserted into the space inside the protruding member 181, followed by release of the external force, the shape of the cushion portion 540 is restored, and the upper edges of the first cushion layer 541 is covered by the detachment prevention portion 182, so that the cushion portion 540 may be fixed on the support frame 110.

Figure 11A:
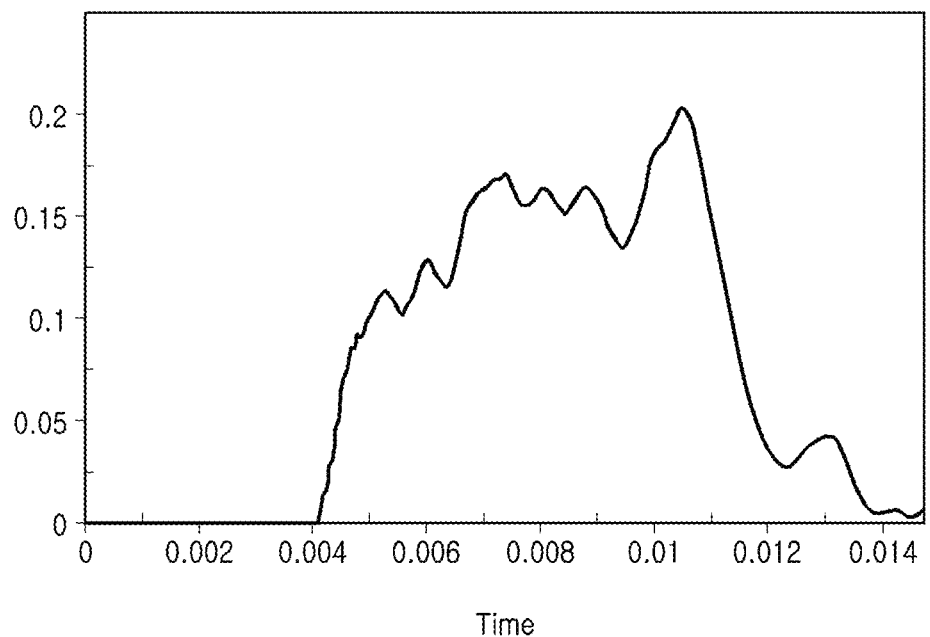
FIG. 11A is a graph showing the gravitational acceleration of the display panel when an impact is applied to the flexible display device according to one embodiment of the present disclosure.
Figure 11B:
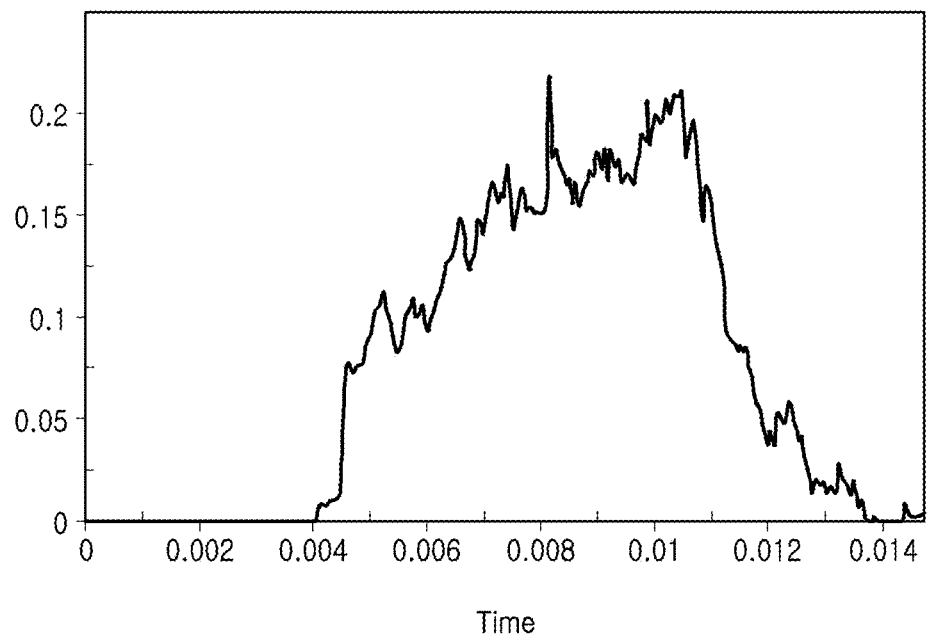
FIG. 11B is a graph showing the gravitational acceleration of the display panel when an impact is applied to the flexible display device according to the comparative embodiment shown in FIG. 3.

FIG. 11A is a graph showing the gravitational acceleration of the display panel when an impact is applied to the flexible display device according to one embodiment of the present disclosure, and FIG. 11B is a graph showing the gravitational acceleration of the display panel when an impact is applied to the flexible display device according to the comparative embodiment shown in FIG. 3. Here, in the flexible display device 100 according to the present disclosure, the cushion portion 140 with a hardness of 20 and a thickness of 3 mm was disposed between the heat dissipation plate 130 and the support frame 110, and in the flexible display device 1 according to the comparative embodiment, an air gap of 3 mm was formed between the heat dissipation plate 130 and the support frame 110.

Referring to FIGS. 11A and 11B, it can be confirmed that, when the cushion portion 140 is provided between the heat dissipation plate 130 and the support frame 110 as in this embodiment, the gravitational acceleration upon application of an impact is lower than that in the comparative embodiment in which the cushion portion 140 is not provided between the heat dissipation plate 130 and the support frame 110. Specifically, when comparing between 0.008 hours and 0.011 hours, it can be seen that the gravitational acceleration can be reduced by about 7% when the cushion portion 140 is provided. This is because when an impact is applied to the display panel 120, the elastic member absorbs the impact.

From these results, it can be seen that, when the cushion portion 140 is provided between the heat dissipation plate 130 and the support frame 110, the durability of the flexible display device 100 may be improved. In particular, when the cushion portion 140 is applied to the flexible display device 100 for a vehicle, which is continuously subject to impacts during driving, it may reduce the impact applied to the display panel 120, thus improving the lifespan.

The embodiments of the present disclosure described above are briefly described as follows.

According to embodiments of the present disclosure, there may be provided a flexible display device including: a support frame having an accommodating space formed therein; a display panel disposed in the accommodating space of the support frame; a heat dissipation plate disposed on the rear surface of the display panel; and a cushion portion disposed between the heat dissipation plate and the support frame and formed to be elastically deformable.

According to embodiments of the present disclosure, the cushion portion may include a thermally conductive material.

According to embodiments of the present disclosure, the thermally conductive material may be composed of a metal or graphite.

According to embodiments of the present disclosure, the cushion portion may include a body portion formed of an expandable foam material, and a thermally conductive coating portion formed on the surface of the body portion.

According to embodiments of the present disclosure, the cushion portion may include an elastically deformable member formed of an expandable foam material and having a plurality of seating holes, and a spring member disposed in each seating hole and formed of a thermally conductive material.

According to embodiments of the present disclosure, the cushion portion may include a cover portion having a plurality of pockets formed therein, and a plurality of spring members disposed inside the pockets.

According to embodiments of the present disclosure, the surface of the cover portion may be coated with a thermally conductive coating material.

According to embodiments of the present disclosure, the cover portion may be fixed to the heat dissipation plate and the support frame by an adhesive member including thermally conductive powder.

According to embodiments of the present disclosure, the cushion portion may be formed of a metal material having a plurality of pores formed therein.

According to embodiments of the present disclosure, the support frame and the cushion portion may be formed integrally with each other.

According to embodiments of the present disclosure, the support frame may include a fixing portion that covers and fixes a portion of the cushion portion within the accommodating space.

According to embodiments of the present disclosure, the fixing portion may include a protruding member that protrudes from the inner bottom surface of the support frame and covers the side of the cushion portion, and a detachment prevention portion that extends inward from an end of the protruding member.

According to embodiments of the present disclosure, the cushion portion may include: a first cushion layer whose sides are covered by the protruding member and a portion of the front side of which is covered by the detachment prevention portion; a second cushion layer which is disposed on the first cushion layer and whose sides are covered by the detachment prevention portion; and a third cushion layer which is disposed on the second cushion layer.

According to embodiments of the present disclosure, the cushion portion may be fixed within the support frame by guide pins protruding from the bottom surface of the support frame.

According to embodiments of the present disclosure, the guide pins may include a plurality of first guide pins supporting the sides of the cushion portion, and a plurality of second guide pins disposed spaced apart from each other inside the first guide pins and penetrating the cushion portion.

According to embodiments of the present disclosure, the support frame may be open at the front thereof and have an opening at the front, and a cover glass shielding the opening may be disposed on the front of the support frame.

According to embodiments of the present disclosure, the heat dissipation plate may be fixed within the support frame by a double-sided foam tape.

According to embodiments of the present disclosure, the double-sided foam tape may be disposed along the rear edges of the heat dissipation plate, and the cushion portion may be disposed inside the double-sided foam tape so as to be spaced apart from the double-sided foam tape.

According to embodiments of the present disclosure, the adhesive layers formed on the front and rear surfaces of the double-sided foam tape may include a thermally conductive material.

According to embodiments of the present disclosure, the cushion portion may be formed to be equal to or greater than the height of the double-sided foam tape and to be smaller than the height of the accommodating space.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A flexible display device, comprising:
   a support frame having an accommodating space formed therein;
   a display panel disposed in the accommodating space of the support frame;
   a heat dissipation plate disposed on a rear surface of the display panel; and
   a cushion portion disposed between the heat dissipation plate and the support frame and formed to be elastically deformable,
   wherein the cushion portion is in direct contact with both the heat dissipation plate and the support frame.

2. The flexible display device of claim 1, wherein the cushion portion comprises a thermally conductive material.

3. The flexible display device of claim 2, wherein the thermally conductive material comprises a metal or graphite.

4. The flexible display device of claim 1, wherein the cushion portion comprises a body portion formed of an expandable foam material, and a thermally conductive coating portion formed on a surface of the body portion.

5. The flexible display device of claim 1, wherein the cushion portion comprises an elastically deformable member formed of an expandable foam material and having a plurality of seating holes, and a spring member disposed in each of the seating holes and formed of a thermally conductive material.

6. The flexible display device of claim 1, wherein the cushion portion comprises a cover portion having a plurality of pockets formed therein, and a plurality of spring members disposed inside the pockets.

7. The flexible display device of claim 6, wherein a surface of the cover portion is coated with a thermally conductive coating material.

8. The flexible display device of claim 6, wherein the cover portion is fixed to the heat dissipation plate and the support frame by an adhesive member comprising thermally conductive powder.

9. The flexible display device of claim 1, wherein the cushion portion is formed of a metal material having a plurality of pores formed therein.

10. The flexible display device of claim 1, wherein the support frame and the cushion portion are formed integrally with each other.

11. The flexible display device of claim 1, wherein the support frame comprises a fixing portion that covers and fixes a portion of the cushion portion within the accommodating space.

12. The flexible display device of claim 11, wherein the fixing portion comprises a protruding member that protrudes from an inner bottom surface of the support frame and covers sides of the cushion portion, and a detachment prevention portion that extends inward from an end of the protruding member.

13. The flexible display device of claim 12, wherein the cushion portion comprises:
- a first cushion layer whose sides are covered by the protruding member and a portion of a front surface of which is covered by the detachment prevention portion;
- a second cushion layer which is disposed on the first cushion layer and whose sides are covered by the detachment prevention portion; and
- a third cushion layer which is disposed on the second cushion layer.

14. The flexible display device of claim 1, wherein the cushion portion is fixed within the support frame by guide pins protruding from a bottom surface of the support frame.

15. The flexible display device of claim 14, wherein the guide pins include a plurality of first guide pins supporting sides of the cushion portion, and a plurality of second guide pins disposed spaced apart from each other inside the first guide pins and penetrating the cushion portion.

16. The flexible display device of claim 15, wherein an end of the first guide pin is coated with a thermally conductive material.

17. The flexible display device of claim 1, wherein the support frame is open at a front thereof and has an opening at the front, and a cover glass shielding the opening is disposed on the front side of the support frame.

18. The flexible display device of claim 1, wherein the heat dissipation plate is fixed within the support frame by a double-sided foam tape.

19. The flexible display device of claim 18, wherein the double-sided foam tape is disposed along rear edges of the heat dissipation plate, and the cushion portion is disposed inside the double-sided foam tape so as to be spaced apart from the double-sided foam tape.

20. The flexible display device of claim 18, wherein adhesive layers formed on front and rear surfaces of the double-sided foam tape comprise a thermally conductive material.

21. The flexible display device of claim 18, wherein a height of the cushion portion is equal to or greater than a height of the double-sided foam tape and smaller than a height of the accommodating space.

* * * * *